United States Patent [19]
Lin

[11] Patent Number: 5,506,524
[45] Date of Patent: Apr. 9, 1996

[54] LOW-VOLTAGE LOW-POWER DYNAMIC FOLDED SENSE AMPLIFIER

[76] Inventor: Jyhfong Lin, 4736 Creekwood Dr., Fremont, Calif. 94555

[21] Appl. No.: 396,591

[22] Filed: Mar. 1, 1995

[51] Int. Cl.⁶ ..................................................... G01R 19/00
[52] U.S. Cl. .................................. 327/57; 327/52; 327/54
[58] Field of Search ................................. 327/51, 52, 53, 327/54, 55, 56, 57; 365/184, 185, 189.01, 203, 205, 210, 189.05, 208

[56] References Cited

U.S. PATENT DOCUMENTS

| 4,511,810 | 4/1985 | Yukawa ........................................ 327/52 |
| 4,697,112 | 9/1987 | Ohtani et al. ................................ 327/55 |
| 4,973,864 | 11/1990 | Nogami ........................................ 327/55 |
| 5,083,295 | 1/1992 | Lammerts et al. ........................... 327/51 |
| 5,258,946 | 11/1993 | Graf ............................................. 327/51 |
| 5,280,205 | 1/1994 | Green et al. ................................. 365/205 |
| 5,400,285 | 3/1995 | Sakata ...................................... 327/189.01 |

OTHER PUBLICATIONS

Seno et al., "A 9–ns 16–Mb CMOS SRAM with Offset–Compensated Current Sense Amplifier," *IEEE Journal of Solid–State Circuits*, vol. 28, No. 11, (Nov. 1993) pp. 1119–1124.

Lee et al., "A 2.5 V CMOS Delay–Locked Loop for an 18 Mbit, 500 Mega–byte/s DRAM," *IEEE Journal of Solid–State Circuits*, vol. 29, No. 12, (Dec. 1994) pp. 1491–1496.

Sasaki et al., "A 7–ns 140–m 1–mb CMOS SRAM with Current Sense Amplifier," *IEEE Journal of Solid–State Circuits*, vol. 27, No. 11, (Nov. 1992) pp. 1511–1518.

Ishibashi et al., "A 12.5–ns 16–Mb CMOS SRAM with Common–Centroid–Geometry–Layout Sense Amplifiers," *IEEE Journal of Solid–State Circuits*, vol. 29, No. 4 (Apr. 1994) pp. 411–418.

Yamauchi et al., "A Circuit Technology for High–Speed Battery–Operated 16–Mb CMOS DRAM's," *IEEE Journal of Solid–State Circuits*, vol. 28, No. 11, (Nov. 1993) pp. 1084–1091.

Sekiyama et al., "A 1–V Operating 256–kb Full–CMOS SRAM," *IEEE Journal of Solid–State Circuits*, vol. 27, No. 5 (May 1992) pp. 776–782.

Blalock et al., "A High–Speed Sensing Scheme for 1T Dynamic RAM's Utilizing the Clamped Bit–Line Sense Amplifier," *IEEE Journal of Solid–State Circuits*, vol. 27, No. 4 (Apr. 1992) pp. 618–625.

Aoki et al., "A 1.5–V DRAM for Battery–Based Applications," *IEEE Journal of Solid–State Circuits*, vol. 24, No. 5 (Oct. 1989) pp. 1206–1212.

Yoo et al., "Variable $V_{cc}$ Design Techniques for Battery–Operated DRAM's," *IEEE Journal of Solid–State Circuit*, vol. 28, No. 4 (Apr. 1993) pp. 499–503.

Seki et al., "A 6–ns 1–Mb CMOS SRAM with Latched Sense Amplifier," *IEEE Journal of Solid–State Circuits*, vol. 28, No. 4 (Apr. 1993) pp. 478–483.

*Primary Examiner*—Timothy P. Callahan
*Assistant Examiner*—Kenneth B. Wells

[57] ABSTRACT

A sense amplifier circuit includes a voltage developing stage which receives first and second data inputs, din1 and din2, and generates, in response to a first control signal $\Phi_1$, a differential voltage indicative of a voltage difference between the first and second data inputs, din1 and din2; a full-swing locking stage which generates and latches, in response to a second control signal $\Phi_2$, first and second latched data outputs, dout1 and dout2, from the differential voltage generated by the voltage developing stage; and a voltage equalization stage which equalizes, in response to a third control signal $\Phi_0$, voltages on data lines respectively connected to the first and second data outputs, dout1 and dout2. Timing of the first, second and third control signals, $\Phi_1$, $\Phi_2$ and $\Phi_0$, is such that the first control signal is activated after a finite period following the initial activation of the third control signal $\Phi_0$, and the second control signal $\Phi_2$ is activated after a finite period following the initial activation of the first control signal $\Phi_1$. To minimize power consumption of the sense amplifier circuit, the first control signal $\Phi_1$ is deactivated when the full-swing locking stage is in operation and the voltage developing stage is not needed, and the third control signal $\Phi_0$ is deactivated when either the voltage developing or full-swing locking stage is in operation and the voltage equalization stage is not needed.

17 Claims, 5 Drawing Sheets

LOW-VOLTAGE LOW-POWER DYNAMIC FOLDED SENSE AMPLIFIER

BACKGROUND OF THE INVENTION

This invention relates in general to sense amplifier circuits and in particular, to a low-power sense amplifier circuit operable with low-voltage power sources to provide, on two output data lines, a latched logic level data output indicative of a voltage difference between two input data lines.

FIGS. 1A and 1B respectively illustrate, as examples, a conventional latched sense amplifier circuit 2, and a block diagram of a sensing circuit 1 which includes the latched sense amplifier circuit 2. The sense amplifier circuit 2 generates complementary data outputs, dout1' and dout2', which are indicative of a differential voltage between two data inputs, din1 and din2, received by the sense amplifier circuit 2. The output voltages, dout1' and dout2', generated by the sense amplifier circuit 2 generally do not reach full-swing (i.e., the HIGH output does not reach Vdd, and the LOW output does not reach GND), because the differential voltage received by the sense amplifier circuit 2 is typically too small. Accordingly, the sensing circuit 1 also includes a latching circuit 3 which generates latched logic level outputs, dout1 and dout2, by pulling the data outputs, dout1' and dout2', up to their respective full-swing or logic level values, and holding them there.

One problem with the sensing circuit 1 of FIG. 1b, is that the latching circuit 3 introduces a delay which reduces the overall performance of the sensing circuit 1. Another problem is that dc power dissipation frequently is unavoidable in such designs. Still another problem is that such designs frequently perform poorly when operated with low voltage sources such as batteries.

OBJECTS AND SUMMARY OF THE INVENTION

Accordingly, one object of the present invention is to provide a high performance sense amplifier circuit providing latched logic level outputs.

Another object to provide is a low-power sense amplifier circuit which consumes minimal power while providing latched logic level outputs.

Another object is to provide a low-voltage sense amplifier circuit which operates with low voltage supply sources, such as a battery, for providing latched logic level outputs.

Still another object is to provide a low cost, easily manufacturable sense amplifier circuit which operates with low voltage supply sources, consumes minimal power, and provides latched logic level outputs.

These and additional objects are accomplished by the various aspects of the present invention, wherein briefly stated, one aspect of the present invention is a low-voltage, low-power dynamic folded sense amplifier circuit which provides a latched logic level data output indicative of a voltage difference between first and second data inputs. The sense amplifier circuit is referred to as being "low-voltage", because it is operable with low voltage power sources, such as a 1.5 volt battery, as well as standard logic level voltage sources, such as a 5.0 volt power supply; it is referred to as being "low-power", because it consumes relatively little power; it is referred to as being "dynamic", because it employs timed control signals to turn on and off portions of its circuitry as they are being used or not, to minimize power consumption; and it is referred to as being "folded", because it resembles in aspects of its structure and operation, a folded cascode amplifier.

Included in the low-voltage, low-power dynamic folded sense amplifier circuit are: a first transistor having a source, a drain, and a gate connected to a first data line providing a first data input; a second transistor having a source, a drain, and a gate connected to a second data line providing a second data input; first switching means for providing, in response to a first control signal being activated, a first reference voltage to the drains of the first and second transistors; means connected to the sources of the first and second transistors, for generating an output indicative of a voltage difference on the gates of the first and second transistors; and second switching means for providing, in response to a second control signal, the first reference voltage to the output generating means such that the output of the output generating means is latched to a voltage level determined by the first reference voltage after a sequence of activating the first and second control signals, then deactivating the first control signal, thereby generating the latched logic level data output indicative of a voltage difference between the first and second data inputs.

Another aspect of the present invention is a method of generating a latched logic level data output indicative of a voltage difference between a first data line and a second data line, comprising: connecting, in response to a first control signal being active, a first voltage corresponding to the first data line to an input of a first inverter and a second voltage corresponding to the second data line to an input of a second inverter, wherein an output of the first inverter is connected to the input of the second inverter and an output of the second inverter is connected to the input of the first inverter such that the first and second inverters form a latch; connecting, in response to a second control signal being active, a reference voltage corresponding to a logic state to the first and second inverters such that the output of the first inverter is pulled to the reference voltage when the output of the first inverter is to be in the logic state and the output of the second inverter is pulled to the reference voltage when the output of the second inverter is to be in the logic state, wherein the logic states of the outputs of the first and second inverters are determined by the relative magnitudes of the first and second voltages respectively connected to the inputs of the first and second inverters; and generating the latched data output at the outputs of the first and second inverters by disconnecting, in response to the first control signal being inactive, the first voltage corresponding to the first data line from the input of the first inverter and the second voltage corresponding to the second data line from the input of the second inverter.

Still another aspect of the present invention is a computer system including a microprocessor, a data bus connected to the microprocessor, and a sense amplifier circuit connected to the data bus, wherein the sense amplifier circuit includes a first transistor having a source, a drain, and a gate connected to a first data input; a second transistor having a source, a drain, and a gate connected to a second data input; first switching means for providing, in response to a first control signal being activated, a first reference voltage to the drains of the first and second transistors; means connected to the sources of the first and second transistors, for generating an output indicative of a voltage difference on the gates of the first and second transistors; and second switching means for providing, in response to a second control signal, the first reference voltage to the output generating means such that the output of the output generating means is latched to a voltage level determined by the first reference voltage after a sequence of activating the first and second control signals, then deactivating the first control signal, thereby generating the latched logic level data output indicative of a voltage difference between the first and second data inputs.

Additional objects, features and advantages of the various aspects of the present invention will be apparent from the following description of its preferred embodiments, which description should be taken in conjunction with the accompanying drawings.

DETAILED DESCRIPTION OF THE PREFERRED EMBODIMENTS

Sense amplifier circuits are useful in a number of circuit applications. For example, they are particularly useful in memory reading circuitry for reading the programmed states of memory cells by sensing voltage differences between bit line pairs connected to individual memory cells. As another example, they are useful in comparator circuitry for comparing a voltage on a data line to another voltage by sensing the voltage difference between two voltages.

Figure 1A:
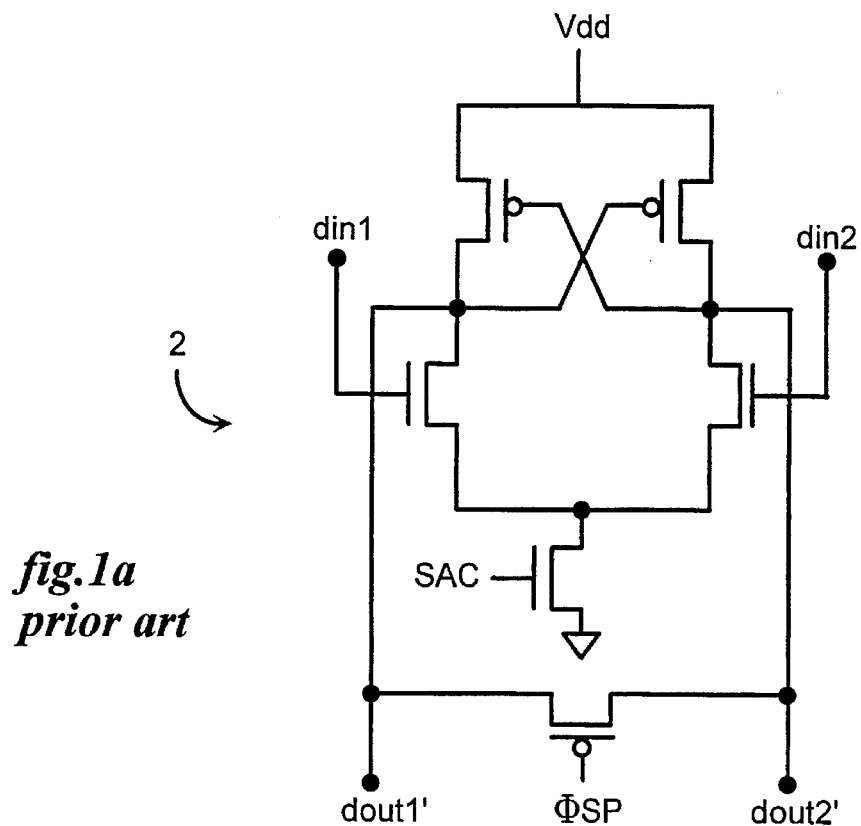
FIGS. 1a and 1b respectively illustrate, as examples, a conventional sense amplifier circuit, and a block diagram of a system including the conventional sense amplifier circuit.
Figure 1B:
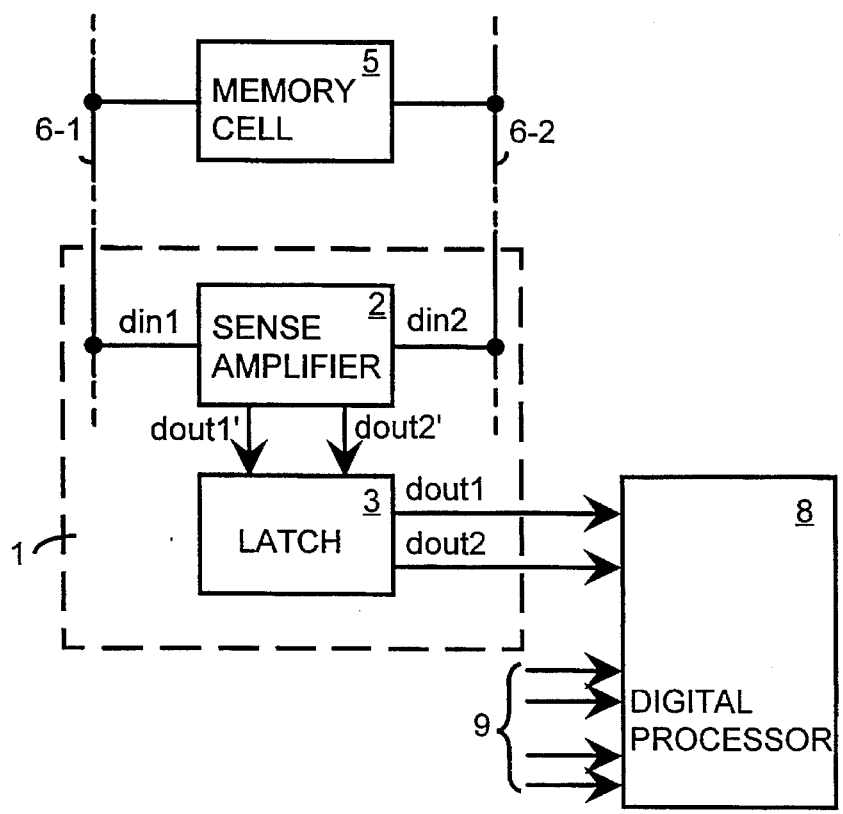
Figure 2:
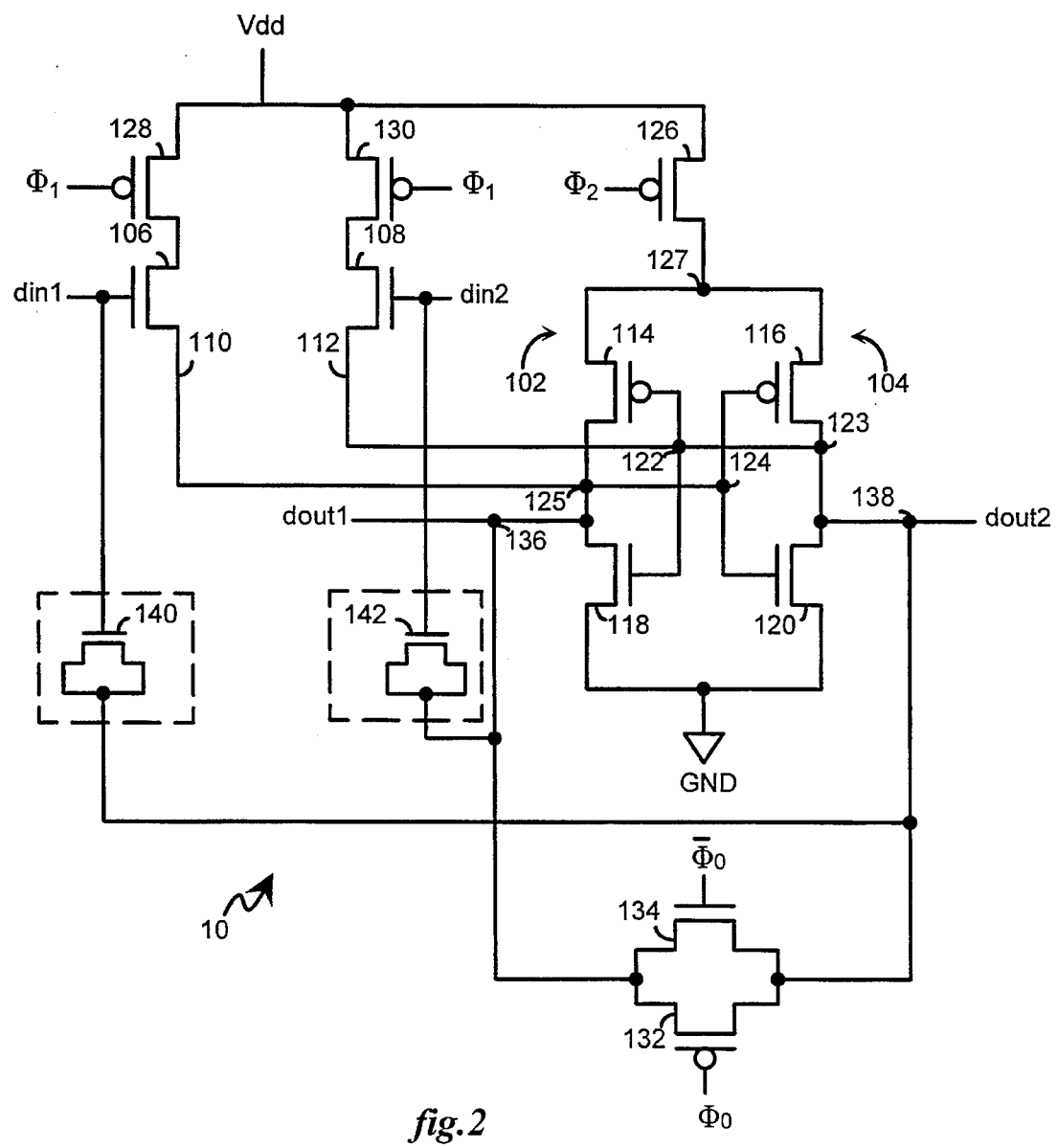
FIG. 2 illustrates, as an example, a sense amplifier circuit utilizing aspects of the present invention.

FIG. 2 illustrates a sense amplifier circuit 10 receiving first and second data inputs, din1 and din2, and generating, in response to control signals, $\Phi_0$, $\Phi_1$, and $\Phi_2$, first and second latched data outputs, dout1 and dout2, having logic states determined by a differential voltage between the first and second data inputs, din1 and din2, and voltage levels determined by high and low reference voltages, Vdd and GND. The first and second data inputs, din1 and din2, are typically respectively received via first and second data lines (e.g., 6-1 and 6-2 in FIG. 1b) from an analog circuit, such as, for example, a memory cell (e.g., 5 in FIG. 1b); and the first and second latched data outputs, dout1 and dout2, are typically respectively provided via first and second output data lines (e.g., 7-1 and 7-2 in FIG. 1b) to a digital circuit, such as, for example, a microprocessor (e.g., 8 in FIG. 1b).

A first or "voltage developing" stage, including p-mos FETs 128 and 130 and n-mos FETs 106 and 108, receives the first and second data inputs, din1 and din2, and tries to generate, in response to a first control signal $\Phi_1$ being active LOW, a differential voltage across first and second outputs, 110 and 112, which is indicative of a voltage difference between the first and second data inputs, din1 and din2. The p-mos FET 128 has a gate connected to the first control signal $\Phi_1$, a source connected to the high reference voltage Vdd, and a drain connected to the drain of the n-mos FET 106. Similarly, the p-mos FET 130 has a gate also connected to the first control signal $\Phi_1$, a source also connected to the high reference voltage Vdd, and a drain connected to the drain of the n-mos FET 108. The n-mos FET 106 has a gate connected to the first data input din1, a drain connected to the drain of p-mos FET 128, and a source providing the first output 110. The n-mos FET 108 has a gate connected to the second data input din2, a drain connected to the drain of p-mos FET 130, and a source providing the second output 112.

While the first control signal $\Phi_1$ is inactive HIGH, the p-mos FETs 128 and 130 are turned off, and no dc current flows through the first stage. When the first control signal $\Phi_1$ becomes active LOW, however, both p-mos FETs 128 and 130 turn on, respectively connecting the high reference voltage Vdd to the drains of the n-mos FETs 106 and 108. Thereupon, with the n-mos FETs 106 and 108 turning on, the voltage at the source of the n-mos FET 106 (i.e., at the first output 110) tries to become equal to the voltage at the gate of the n-mos FET 106 less the threshold voltage of the n-mos FET 106, and the voltage at the source of the n-mos FET 108 (i.e., at the second output 112) tries to become equal to the voltage at the gate of the n-mos FET 108 less the threshold voltage of the n-mos FET 108. Since the threshold voltages of the n-mos FETs 106 and 108 are preferably equal (i.e., the transistors are matched), the first stage tries to generate a voltage difference across the first and second outputs, 110 and 112, which is substantially equal to the voltage difference between the first and second data inputs, din1 and din2.

A second or "full-swing locking" stage, includes a p-mos FET 126, and a latching circuit comprising first and second cross-coupled inverters, 102 and 104. The p-mos FET 126 connects, in response to a second control signal $\Phi_2$ being active LOW, the high voltage reference Vdd to a power input 127 of the latching circuit. In particular, the source of p-mos FET 126 is connected to the high voltage reference Vdd, the gate of p-mos FET 126 is connected to the second control signal $\Phi_2$, and the drain of p-mos FET 126 is connected to the power input 127 of the latching circuit. Although a complementary n-mos FET might also be included in the second stage to connect, in response to the second control signal $\Phi_2$ being active LOW, the low voltage reference GND to the latching circuit, it is preferable not to include such a complementary n-mos FET. One reason that it is preferable not to include such a complementary n-mos FET is that its elimination allows a differential voltage indicative of a voltage difference between the first and second data inputs, din1 and din2, to develop faster on the first and second data outputs, dout1 and dout2, during a period where the first control signal $\Phi_1$ is active LOW and the second control signal $\Phi_2$ is inactive HIGH.

The latching circuit, including p-mos FETs 114 and 116 and n-mos FETs 118 and 120, generates and latches, in response to voltages initially provided by the first stage at its outputs, 110 and 112, the first and second latched data outputs, dout1 and dout2. The latching circuit is preferably formed of first and second cross-coupled inverters, wherein an output 125 of the first inverter 102 is connected to an input 124 of the second inverter 104, and an output 123 of the second inverter 104 is connected to an input 122 of the first inverter 102. The first inverter 102 comprises a p-mos FET 114 and a n-mos FET 118, wherein the source of the p-mos FET 114 is connected to the power input node 127, the source of the n-mos FET 118 is connected to the low reference voltage GND, the gates of the p-mos FET 114 and the n-mos FET 118 are connected together to form the input 122 of the first inverter 102, and the drains of the p-mos FET 114 and the n-mos FET 118 are connected together to form the output 125 of the first inverter 102. Connected to the input 122 of the first inverter 102 is the second output 112 of the first stage. The second inverter 104 comprises a p-mos FET 116 and a n-mos FET 120, wherein the source of the p-mos FET 116 is connected to the power input node 127, the source of the n-mos FET 120 is connected to the low reference voltage GND, the gates of the p-mos FET 116 and the n-mos FET 120 are connected together to form the input 124 of the second inverter 104, and the drains of the p-mos FET 116 and the n-mos FET 120 are connected together to form the output 123 of the second inverter 104. Connected to the input 124 of the second inverter 104 is the first output 110 of the first stage.

A third or "voltage equalizing" stage, including a p-mos FET 132 and a n-mos FET 134, equalizes, in response to a third control signal $\Phi_0$ being active LOW, voltages on data lines (not shown) respectively connected at nodes 136 and 138 to the first and second data outputs, dout1 and dout2. In particular, the p-mos FET 132 and the n-mos FET 134 form a transmission gate which shorts (i.e., connects) nodes 136 and 138 together when the third control signal $\Phi_0$ is active LOW, and isolates (i.e., disconnects) nodes 136 and 138 from each other when the third control signal $\Phi_0$ is inactive HIGH.

Optionally, a first capacitor 140 may be connected between the first data input, din1, and the second data output, dout2, and a second capacitor 142 may be connected between the second data input, din2, and the first data output, dout1, to avoid clock feedthrough noise to the data lines by respectively providing charge compensation for n-mos FETs 110 and 112. As depicted in FIG. 2, the first capacitor 140, when included in the sense amplifier circuit 10, is preferably an n-mos FET having its gate electrode functions as one electrode of the first capacitor 140, and its connected together drain and source electrodes functions as the other electrode of the first capacitor 140. Similarly, the second capacitor 142, when included in the sense amplifier circuit 10, is preferably a n-mos FET having its gate electrode function as one electrode of the second capacitor 142, and its connected together drain and source electrodes function as the other electrode of the second capacitor 142. The first and second capacitors, 140 and 142, are shown in a dotted box in FIG. 2, to emphasize that their inclusion in the sense amplifier circuit 10 is optional. For example, if the sense amplifier circuit 10 receives as first and second inputs, a pair of bit lines connected to a memory cell, typically, such bit lines are connected to an equalizing circuit which eliminates the need for such first and second capacitors, 140 and 142, providing charge compensation.

To minimize power consumption in the sense amplifier circuit 10, timing of the first, second, and third control signals, $\Phi_1$, $\Phi_2$, and $\Phi_0$, are such that the first control signal $\Phi_0$ is preferably deactivated after the voltage developing stage is no longer needed (e.g., shortly after the second control signal $\Phi_2$ activates the full-swing locking stage), and the third control signal $\Phi_0$ is preferably deactivated when the voltage equalization stage is not needed (e.g., when either the voltage developing or full-swing locking stages are in operation). Although it is preferable to deactivate the first and second control signals, $\Phi_1$ and $\Phi_2$, when activating the third control signal $\Phi_0$ to equalize the voltages on the first and second output data lines (not shown), in applications where additional power consumption can be sacrificed for enhanced performance, it may be preferable to keep the second control signal $\Phi_2$ active when activating the third control signal $\Phi_0$ to equalize the voltages on the first and second output data lines (not shown).

Figure 3:
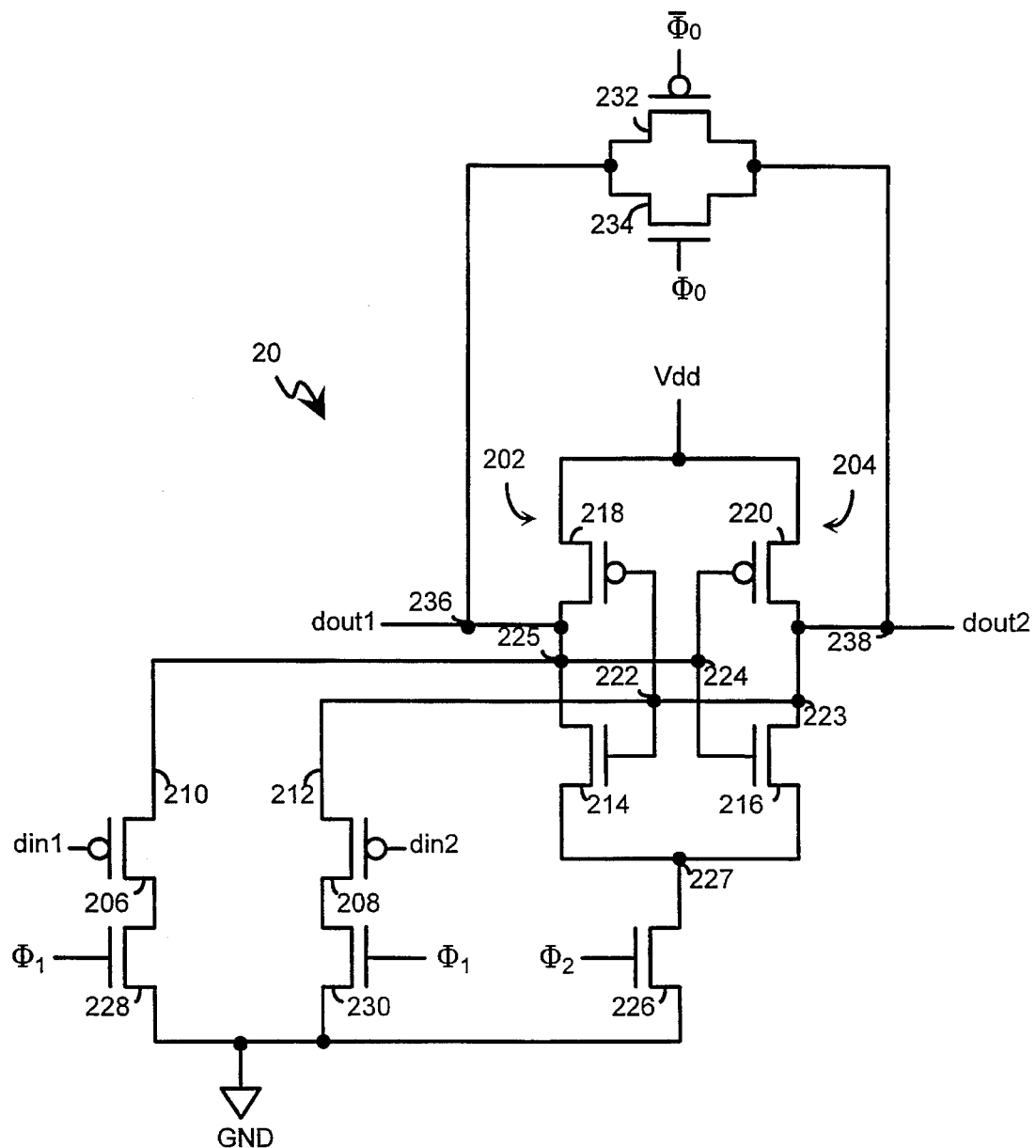
FIG. 3 illustrates, as an example, an alternative sense amplifier circuit utilizing aspects of the present invention.

FIG. 3 illustrates, as an example, an alternative sense amplifier circuit 20, utilizing aspects of the present invention, which functions in a similar manner to the sense amplifier circuit 10. In the sense amplifier circuit 20, a first or "voltage developing" stage, including n-mos FETs 228 and 230 and p-mos FETs 206 and 208, receives the first and second data inputs, din1 and din2, and tries to generate, in response to a first control signal $\Phi_1$ being active HIGH, a differential voltage across first and second outputs, 210 and 212, which is indicative of a voltage difference between the first and second data inputs, din1 and din2. The n-mos FET 228 has a gate connected to the first control signal $\Phi_1$, a source connected to the low reference voltage GND, and a drain connected to the drain of the p-mos FET 206. Similarly, the n-mos FET 230 has a gate also connected to the first control signal $\Phi_1$, a source also connected to the low reference voltage GND, and a drain connected to the drain of the p-mos FET 208. The p-mos FET 206 has a gate connected to the first data input din1, a drain connected to the drain of n-mos FET 228, and a source providing the first output 210. The p-mos FET 208 has a gate connected to the second data input din2, a drain connected to the drain of the n-mos FET 230, and a source providing the second output 212.

While the first control signal $\Phi_1$ is inactive LOW, the n-mos FETs 228 and 230 are turned off, and no dc current flows through the first stage. When the first control signal $\Phi_1$ becomes active HIGH, however, both n-mos FETs 228 and 230 turn on, respectively connecting the low reference voltage GND to the drains of the p-mos FETs 206 and 208. Thereupon, with the p-mos FETs 206 and 208 turning on, the voltage at the source of the p-mos FET 206 (i.e., at the first output 210) tries to become equal to the voltage at the gate of the p-mos FET 206 less the threshold voltage of the p-mos FET 206, and the voltage at the source of the p-mos FET 208 (i.e., at the second output 112) tries to become equal to the voltage at the gate of the p-mos FET 208 less the threshold voltage of the p-mos FET 208. Since the threshold voltages of the p-mos FETs 206 and 208 are preferably equal (i.e., the transistors are matched), the first stage tries to generate a voltage difference across the first and second outputs, 210 and 212, which is substantially equal to the voltage difference between the first and second data inputs, din1 and din2.

A second or "full-swing locking" stage, includes a n-mos FET 226, and a latching circuit comprising first and second cross-coupled inverters, 202 and 204. The n-mos FET 226 connects, in response to a second control signal $\Phi_2$ being active HIGH, the low voltage reference GND to a ground input 227 of the latching circuit. In particular, the source of n-mos FET 226 is connected to the low voltage reference GND, the gate of n-mos FET 226 is connected to the second control signal $\Phi_2$, and the drain of n-mos FET 226 is connected to the ground input 227 of the latching circuit.

The latching circuit, including n-mos FETs 214 and 216 and p-mos FETs 218 and 220, generates and latches, in response to voltages initially provided by the first stage at its outputs, 210 and 212, the first and second latched data outputs, dout1 and dout2. The latching circuit is preferably formed of first and second cross-coupled inverters, wherein an output 225 of the first inverter 202 is connected to an input 224 of the second inverter 204, and an output 225 of the second inverter 204 is connected to an input 222 of the first inverter 202. The first inverter 202 comprises an n-mos FET 214 and a p-mos FET 218, wherein the source of the n-mos FET 214 is connected to the ground input node 227, the source of the p-mos FET 218 is connected to the high reference voltage Vdd, the gates of the n-mos FET 214 and the p-mos FET 218 are connected together to form the input 222 of the first inverter 202, and the drains of the n-mos FET 214 and the p-mos FET 218 are connected together to form the output 225 of the first inverter 202. Connected to the input 222 of the first inverter 202 is the second output 212 of the first stage. The second inverter 204 comprises a n-mos FET 216 and a p-mos FET 220, wherein the source of the n-mos FET 216 is connected to the ground input node 227, the source of the p-mos FET 220 is connected to the high reference voltage Vdd, the gates of the n-mos FET 216 and the p-mos FET 220 are connected together to form the input 224 of the second inverter 204, and the drains of the n-mos FET 216 and the p-mos FET 220 are connected together to form the output 223 of the second inverter 204. Connected to the input 224 of the second inverter 204 is the first output 210 of the first stage.

A third or "voltage equalizing" stage, including a p-mos FET 232 and a n-mos FET 234, equalizes, in response to a third control signal $\Phi_0$ being active HIGH, voltages on data lines (not shown) respectively connected at nodes 236 and 238 to the first and second data outputs, dout1 and dout2. In particular, the p-mos FET 232 and the n-mos FET 234 form a transmission gate which shorts (i.e., connects) nodes 236 and 238 together when the third control signal $\Phi_0$ is active HIGH, and isolates (i.e., disconnects) nodes 236 and 238 from each other when the third control signal $\Phi_0$ is inactive LOW.

To minimize power consumption in the sense amplifier circuit 20, timing of the first, second, and third control signals, $\Phi_1$, $\Phi_2$, and $\Phi_0$, are such that the first control signal $\Phi_1$ is preferably deactivated after the voltage developing stage is no longer needed (e.g., shortly after the second control signal $\Phi_2$ activates the full-swing locking stage), and the third control signal $\Phi_0$ is preferably deactivated when the voltage equalization stage is not needed (e.g., when either the voltage developing or full-swing locking stages are in operation). Although it is preferable to deactivate the first and second control signals, $\Phi_1$ and $\Phi_2$, when activating the third control signal $\Phi_0$ to equalize the voltages on the first and second output data lines (not shown), in applications where additional power consumption can be sacrificed for enhanced performance, it may be preferable to keep the second control signal $\Phi_2$ active when activating the third control signal $\Phi_0$ to equalize the voltages on the first and second output data lines (not shown).

Figure 4:
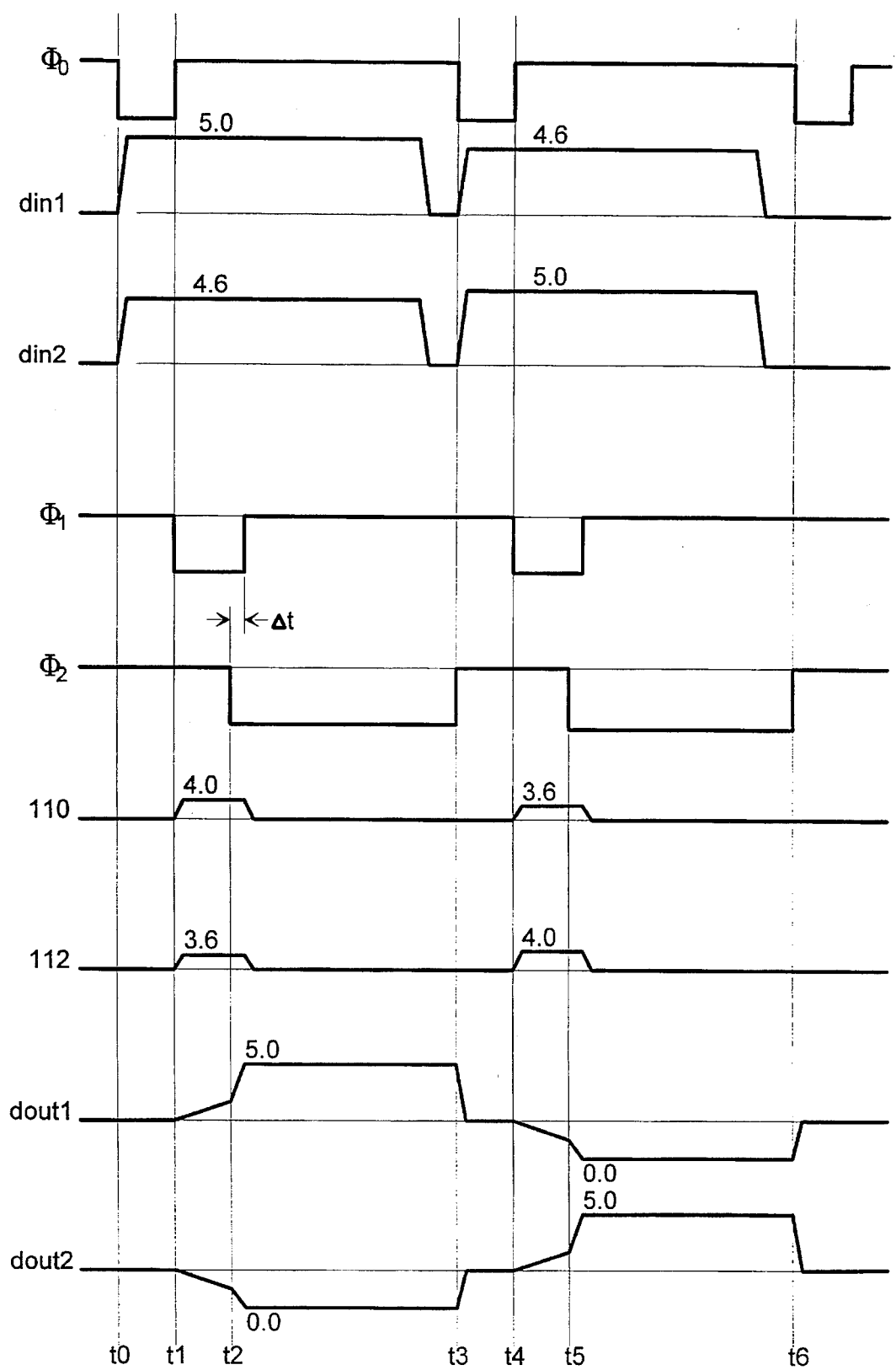
FIG. 4 illustrates, as examples, timing diagrams of certain inputs, outputs, and selected nodes of the sense amplifier circuit of FIG. 2, utilizing aspects of the present invention.

FIG. 4 illustrates timing diagrams useful for describing the operation of the sense amplifier circuit 10. Between time t0 and t1, the sense amplifier circuit 10 operates in a voltage-equalization mode, wherein it equalizes the voltages on the first and second data lines (not shown), which are respectively connected to the first and second data outputs, dout1 and dout2. During this mode, the third control signal $\Phi_0$ is active LOW, and the first and second control signals, $\Phi_1$ and $\Phi_2$, are preferably inactive HIGH. By making the first and second control signals, $\Phi_1$ and $\Phi_2$, inactive HIGH, the p-mos FETs 126, 128, and 130 are turned off, effectively disconnecting the high reference voltage Vdd from the circuit. This minimizes the flow of dc current in the circuit and consequently, minimizes the power consumed by the circuit. If power consumption is not a concern, however, either the first and/or second control signal, $\Phi_1$ and $\Phi_2$, may be kept active LOW when activating the third control signal $\Phi_0$ to equalize the voltages on the first and second data lines (not shown). By making the third control signal $\Phi_0$ active LOW, both the p-mos FET 132 and the n-mos FET 134 turn on, effectively connecting the first and second data lines (not shown) together at nodes 136 and 138. This causes the voltage at node 136 (connected to the first data line) to become equal to the voltage at node 138 (connected to the second data line).

Between time t1 and t2, the sense amplifier circuit 10 operates in a voltage-developing mode, wherein it generates or develops a relatively small differential voltage across the first and second data outputs, dout1 and dout2, which is indicative of a voltage difference between the first and second data inputs, din1 and din2. At or prior to time t1, input voltages are provided on the first and second data inputs, din1 and din2, respectively connected to the gates of n-mos FETs 106 and 108, wherein the difference between the voltages thus provided determines the logic state of the output data to be latched by the sense amplifier circuit 10. Although the first and second data inputs, din1 and din2, preferably reach their respective full values prior to time t1, as depicted for example in FIG. 4, this is not a requirement for the sense amplifier circuit 10 to function properly. The sense amplifier circuit 10 will still function properly as long as a significant differential voltage, such as 0.2 volts, develops across the first and second data inputs, din1 and din2, by time t1. Thence, at time t1, the third control signal $\Phi_0$ goes inactive HIGH, turning off the p-mos FET 132 and the n-mos FET 134, so that the voltages at nodes 136 and 138 are no longer forced to being equal. Also at time t1, the first control signal $\Phi_1$ preferably goes active LOW, turning on p-mos FETs 128 and 130, so that a voltage equal to the voltage provided on the first data input din1 less the threshold voltage of the n-mos FET 106 tries to develop at the source of the n-mos FET 106 (i.e., at the first output 110 of the first stage), and a voltage equal to the voltage provided on the second data input din2 less the threshold voltage of the n-mos FET 108 tries to develop at the source of the n-mos FET 108 (i.e., at the second output 112 of the first stage).

Accordingly, by designing the threshold voltages of the n-mos FETs 106 and 108 to be equal, a differential voltage tries to develop across their sources which follows a differential voltage provided across their gates. A contention situation arises, however, and the logic state of the latched data output of the sense amplifier circuit 10 is determined by the higher of the two voltages trying to be developed at the sources of the n-mos FETs 106 and 108. For example, if the threshold voltage of both n-mos FETs 106 and 108 is 1.0 volts, and the voltages provided on the first and second data inputs, din1 and din2, are respectively 5.0 and 4.6 volts (e.g., a differential input voltage of 0.4 volts), then the voltage at the source of the n-mos FET 106 (i.e., at the first output 110 of the first stage) will try to be 4.0 volts and the voltage at the source of the n-mos FET 108 (i.e., at the second output 112 of the first stage) will try to be 3.6 volts (e.g., a differential voltage of 0.4 volts). Although both voltages being applied to the inputs, 122 and 124, of the inverters, 102 and 104, try to drive their respective outputs, 125 and 123, towards a LOW logic state, only the output 123 of the second inverter 104 is driven towards that state, because the voltage trying to be developed (e.g., 4.0 volts) at the input 124 to the second inverter 104 is greater than the voltage trying to be developed (e.g., 3.6 volts) at the input 122 to the first inverter 102. Consequently, the second data output dout2 is driven towards a LOW logic state, and the first data output dout1 is forced towards a HIGH logic state.

As another example indicative of battery powered circuits, if the threshold voltage of both n-mos FETs 106 and 108 is 0.8 volts, and the voltages provided on the first and second data inputs, din1 and din2, are respectively 2.0 and 1.5 volts (e.g., a differential input voltage of 0.5 volts), then the voltage at the source of the n-mos FET 106 (i.e., at the first output 110 of the first stage) will try to be 1.2 volts and the voltage at the source of the n-mos FET 108 (i.e., at the second output 112 of the first stage) will try to be 0.7 volts (e.g., a differential voltage of 0.5 volts). In this case, unlike the previous example, however, the voltage trying to be developed at the input 124 of the inverter 104 tries to drive its output 123, towards a LOW logic state, while the voltage applied to the input 122 of the inverter 102 is probably inadequate to turn on n-mos FET 118 to drive its output 125 towards a LOW logic state (e.g., if the threshold voltage of n-mos FET 118 is 0.8 volts). Consequently, the second data output dout2 is driven towards a LOW logic state, and the first data output dout1 is forced towards a HIGH logic state.

Since the second control signal $\Phi_2$ is inactive HIGH during the period between time t1 and t2, the high voltage reference Vdd is not connected to the power input node 127 of the inverters, 102 and 104, during that time. Consequently, the power input node 127 is floating, and the data output (dout1 or dout2) being driven to a HIGH logic state, cannot fully reach a voltage level corresponding to that logic state (e.g., the high reference voltage Vdd). The low voltage reference GND, however, is connected to the sources of the n-mos FETs 118 and 120 respectively of the first and second inverters 102 and 104, therefore the data output (dout2 or dout1) being driven to a LOW logic state, may reach the voltage level corresponding to that logic state (e.g., the low reference voltage GND).

Between time t2 and t3, the sense amplifier circuit 10 operates in a full-swing locking mode, wherein it accelerates the rate at which the output (dout1 or dout2) rising to a HIGH logic state rises, increases the voltage level to which the output (dout1 or dout2) rising to a HIGH logic state rises to, generates the latched data output by latching the output (dout1 or dout2) rising to a HIGH logic state to the HIGH logic state at the increased voltage level and the output (dout2 or dout1) being forced to a LOW logic state to the LOW logic state at a voltage level substantially equal to the low reference voltage GND, and minimizes the dc current flowing through the circuit to minimize the power being consumed by the circuit during the latching mode.

At time t2, the second control signal $\Phi_2$ is activated LOW, causing the p-mos FET 126 to turn on and consequently, the high voltage reference Vdd to be connected to the power input 127 of the first and second inverters, 102 and 104. As a result, the output of the inverter (dout1 or dout2) rising to a HIGH logic state, fully swings to the high reference voltage Vdd, the output of the inverter (dout2 or dout1) falling to a LOW logic state, fully swings to the low reference voltage GND, and the two outputs lock there, since they reinforce each other through the cross-coupled feedback of the two inverters, 102 and 104.

Preferably, the first control signal $\Phi_1$ is inactivated HIGH shortly after time t2, to minimize power consumption. In particular, by so doing, generally no dc current flows through either the first or voltage developing stage of the sense amplifier circuit 10, or the second or full-swing locking stage of the sense amplifier circuit 10. No dc current flows through the first stage, because the p-mos FETs 128 and 130 are turned off. No dc current flows through the second stage, after the data outputs, dout1 and dout2, lock to full swing because no dc current flows through the series connected p-mos and n-mos FETs comprising each of the first and second inverters, 102 and 104. For example, if the p-mos FET 114 is turned on, then the n-mos FET 118 is turned off, and no dc current flows through the first inverter 102. Conversely, if the p-mos FET 114 is turned off, then the n-mos FET 118 is turned on, and again, no dc current flows through the first inverter 102. Similarly, if the p-mos FET 116 is turned on, then the n-mos FET 120 is turned off, and no dc current flows through the second inverter 104; and if the p-mos FET 116 is turned off, then the n-mos FET 120 is turned on, and again, no dc current flows through the second inverter 104.

The first control signal $\Phi_1$ is preferably not inactivated HIGH immediately at time t2, however. As shown in FIG. 4, the first control signal $\Phi_1$ is preferably inactivated after a time delay $\Delta t$ following the second control signal $\Phi_2$ being activated LOW, wherein the duration of the time delay $\Delta t$ is selected so as to practically eliminate the latching of spurious noise signals on the inverter inputs, 122 and 124, resulting in erroneous logic level output data being latched by the sense amplifier circuit 10. As an example, a time delay $\Delta t$ of 0.5 to 1.0 nanoseconds is believed adequate for such purposes using presently available CMOS processes.

During time t3 to t6, the above described operation of the sense amplifier circuit 10 is repeated with the difference that the voltages applied to the first and second data inputs, din1 and din2, to the sense amplifier circuit 10, are reversed. As shown in FIG. 4, by reversing the voltages applied to the first and second data inputs, din1 and din2, the latched data output, dout1 and dout2, reverses. In particular, as depicted in the first cycle represented by the time period t0 to t3, the first latched data output dout1 is latched to a HIGH logic state (e.g., logic level voltage of 5.0 volts) and the second latched data output dout2 is latched to a LOW logic state (e.g., logic level voltage of 0.0 volts) when voltages of 5.0 and 4.6 volts are respectively applied, for example, to the first and second data inputs, din1 and din2, and as depicted in the second cycle represented by the time period t3 to t6, the first latched data output dout1 is latched to a LOW logic state and the second latched data output dout 2 is latched to a HIGH logic state when the reversed voltages of 4.6 and 5.0 volts are respectively applied to the first and second data inputs, din1 and din2.

Figure 5:
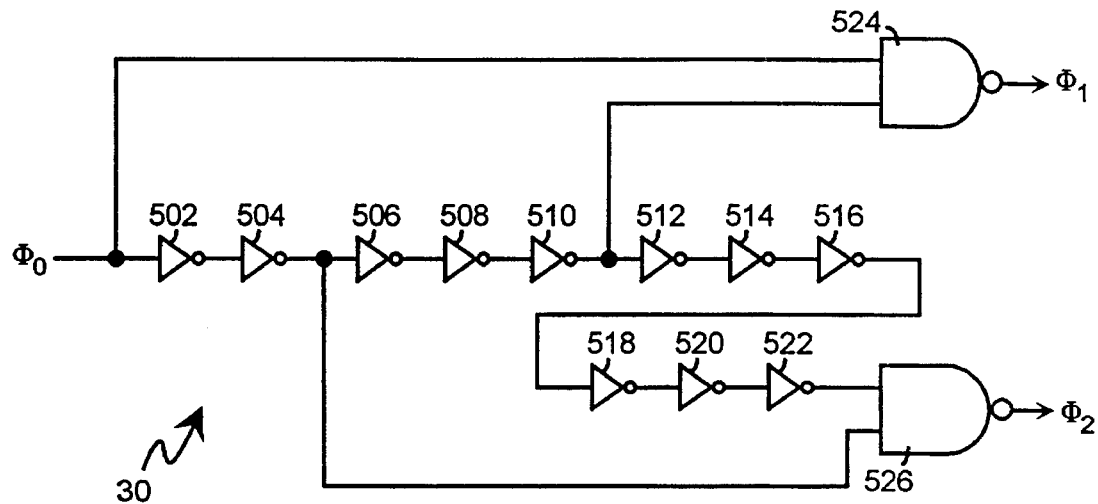
FIG. 5 illustrates, as an example, a logic diagram for a control signal generating unit.

FIG. 5 illustrates, as an example, a logic circuit 30 for generating the first and second control signals, $\Phi_1$ and $\Phi_2$, from the third control signal $\Phi_0$. In this example, the third control signal $\Phi_0$ is connected to a first input of a first NAND gate 524, and an inverted and delayed version of the third control signal $\Phi_0$ is connected to a second input of the first NAND gate 524 to generate the first control signal $\Phi_0$, wherein the inverted and delayed version of the third control signal $\Phi_0$ is generated through an odd number of series connected inverters, 502–510, having a total propagation delay equal to the desired time delay between initiation of the third control signal $\Phi_0$ and the first control signal $\Phi_1$. Similarly, a delayed version of the third control signal $\Phi_0$ is connected to a first input of a second NAND gate 526, and an inverted and delayed version of the third control signal $\Phi_0$ is connected to a second input of the second NAND gate 526 to generate the second control signal $\Phi_2$, wherein the delayed version of the third control signal $\Phi_0$ is generated through an even number of series connected inverted, 502–504, and the inverted and delayed version of the third control signal $\Phi_0$ is generated through an odd number of series connected inverters, 502–522, having a total propagation delay equal to the desired time delay between initiation of the third control signal $\Phi_0$ and the second control signal $\Phi_2$.

Figure 6:
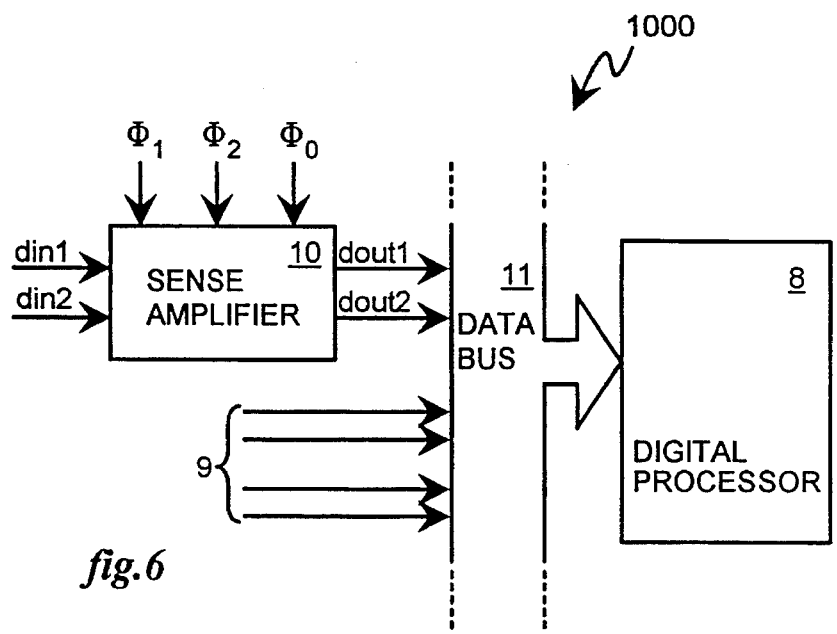
FIG. 6 illustrates, as an example, a block diagram of a microprocessor system including the sense amplifier circuit of either FIG. 2 or FIG. 3, utilizing aspects of the present invention.

FIG. 6 illustrates, as an example, a computer system 1000 including the sense amplifier circuit 10 (or alternatively, the sense amplifier circuit 20), a digital processor 8, and a data bus 11. The sense amplifier circuit 10 (or alternatively, the sense amplifier circuit 20) receives first and second data inputs, din1 and din2, and generates first and second latched data outputs, dout1 and dout2, in a manner described with reference to FIGS. 2–4.

As an example, the first and second data inputs, din1 and din2, may be provided by respective first and second bit lines of a bit line pair connected to a memory cell. In this case, the sense amplifier circuit 10 (or alternatively, the sense amplifier circuit 20) preferably provides its latched logic level data outputs, dout1 and dout2, to respective tri-state drivers (not shown) of the data bus 11, which in turn, provide their outputs to the digital processor 8 when enabled by the digital processor 8. The digital signal processor 8, which may be any one of numerous commercially available microprocessors, such as the type manufactured by Intel and Motorola, then processes the latched data outputs, dout1 and dout2, received from the sense amplifier circuit 10 (or alternatively, the sense amplifier circuit 20), along with other data outputs 9 received, for example, from one or more other circuits (not shown) in the computer system 1000.

As another example, the first and second data inputs, din1 and din2, may be provided by respective first and second analog data lines, wherein the first analog data line is connected to a reference voltage and the second analog data line is connected to a voltage which is to be compared against the reference voltage. In this case, the sense amplifier circuit 10 (or alternatively, the sense amplifier circuit 20) functioning as a comparator, may again provide its latched logic level data outputs, dout1 and dout2, to respective tri-state drivers (not shown) of the data bus 11, which in turn, provide their outputs to the digital processor 8 when enabled by the digital processor 8. The digital signal processor 8 then processes the latched data outputs, dout1 and dout2, received from the sense amplifier circuit 10 (or alternatively, the sense amplifier circuit 20), along with other data outputs 9 received, for example, from one or more other circuits (not shown) in the computer system 1000.

Although the various aspects of the present invention have been described with respect to a preferred embodiment, it will be understood that the invention is entitled to full protection within the full scope of the appended claims.

What is claimed is:

1. A sense amplifier circuit generating a latched data output indicative of a voltage difference between a first and a second data input, comprising:

a first transistor having a source, a drain, and a gate connected to said first data input, a second transistor having a source, a drain, and a gate connected to said second data input, first switching means for providing, in response to a first control signal being activated, a first reference voltage to said drains of said first and second transistors, means connected to said sources of said first and second transistors, for generating an output indicative of a voltage difference on said gates of said first and second transistors, and second switching means for providing, in response to a second control signal, said first reference voltage to said output generating means such that said output of said output generating means is latched to a voltage level determined by said first reference voltage after a sequence of activating said first and second control signals, then deactivating said first control signal, thereby generating said latched data output indicative of said voltage difference between said first and second data inputs.

2. The sense amplifier circuit as recited in claim 1, wherein said first switching means comprises:

a third transistor having a source connected to said first reference voltage, a drain connected to said drain of said first transistor, and a gate connected to said first control signal, and a fourth transistor having a source connected to said first reference voltage, a drain connected to said drain of said second transistor, and a gate connected to said first control signal.

3. The sense amplifier circuit as recited in claim 1, wherein said second switching means comprises a fifth transistor having a source connected to said first reference voltage, a drain connected to said output generating means, and a gate connected to said second control signal.

4. The sense amplifier circuit as recited in claim 1, wherein said output generating means comprises:

a first inverter having a data input, a data output, and a reference voltage input connected to said second switching means for receiving said first reference voltage from said second switching means, and a second inverter having a data input, a data output, and a reference voltage input connected to said reference voltage input of said first inverter and said second switching means for receiving said first reference voltage from said second switching means, wherein said output of said second inverter is connected to said source of said second transistor and to said input of said first inverter, and said output of said first inverter is connected to said source of said first transistor and to said input of said second inverter.

5. The sense amplifier circuit as recited in claim 4, further comprising:

a first capacitor connected between said gate of said first transistor and said data output of said second inverter, to provide charge compensation for said first transistor, and a second capacitor connected between said gate of said second transistor and said data output of said first inverter, to provide charge compensation for said second transistor.

6. The sense amplifier circuit as recited in claim 4, wherein said first inverter comprises:

a sixth transistor having a source, a drain, and a gate, and a seventh transistor having a source, a drain, and a gate, wherein said source of said sixth transistor acts as said reference voltage input of said first inverter, said gates of said sixth and seventh transistors are connected together to form said data input of said first inverter, and said drains of said sixth and seventh transistors are connected together to form said data output of said first inverter.

7. The sense amplifier circuit as recited in claim 4, wherein said second inverter comprises:

a eighth transistor having a source, a drain, and a gate, and a ninth transistor having a source, a drain, and a gate, wherein said source of said eighth transistor acts as said reference voltage input of said second inverter, said gates of said eighth and ninth transistors are connected together to form said data input of said second inverter, and said drains of said eighth and ninth transistors are connected together to form said data output of said second inverter.

8. The sense amplifier circuit as recited in claim 1, wherein said latched data output generated by said output generating means is connected to first and second output data lines, and further comprising equalizing means for equalizing voltages respectively on said first and second output data lines in response to a third control signal being activated.

9. The sense amplifier circuit as recited in claim 8, wherein said equalizing means comprises:

a tenth transistor having a source, a drain, and a gate connected to said third control signal, and an eleventh transistor having a source, a drain, and a gate connected to an inverted version of said third control signal, wherein said source of said tenth transistor is connected to said drain of said eleventh transistor and to said first data output line, and said drain of said tenth transistor is connected to said source of said eleventh transistor and to said second data output line.

10. A method of generating a latched data output indicative of a voltage difference between a first and a second data line, comprising:

connecting, in response to a first control signal being active, a first voltage corresponding to said first data line to an input of a first inverter and a second voltage corresponding to said second data line to an input of a second inverter, wherein an output of said first inverter is connected to said input of said second inverter and an output of said second inverter is connected to said input of said first inverter such that said first and second inverters form a latch, connecting, in response to a second control signal being active, a reference voltage corresponding to a logic state to said first and second inverters such that said output of said first inverter is pulled to said reference voltage when said output of said first inverter is to be in said logic state and said output of said second inverter is pulled to said reference voltage when said output of said second inverter is to be in said logic state, wherein the logic states of said outputs of said first and second inverters are determined by the relative magnitudes of said first and second voltages respectively connected to said inputs of said first and second inverters, and generating said latched data output at said outputs of said first and second inverters by disconnecting, in response to said first control signal being inactive, said first voltage corresponding to said first data line from said input of said first inverter and said second voltage corresponding to said second data line from said input of said second inverter.

11. The method as recited in claim 10, further comprising:

connecting said output of said first inverter to a first output data line and said output of said second inverter to a second output data line, and equalizing, in response to a third control signal being active, voltages respectively on said first and second output data lines.

12. A computer system comprising:

a microprocessor, a data bus connected to said microprocessor, and a sense amplifier circuit connected to said data bus, wherein said sense amplifier circuit generates a latched data output indicative of a voltage difference between a first and a second data line, and said sense amplifier circuit includes a first transistor having a source, a drain, and a gate connected to said first data input, a second transistor having a source, a drain, and a gate connected to said second data input, first switching means for providing, in response to a first control signal being activated, a first reference voltage to said drains of said first and second transistors, means connected to said sources of said first and second transistors, for generating an output indicative of a voltage difference on said gates of said first and second transistors, and second switching means for providing, in response to a second control signal, said first reference voltage to said output generating means such that said output of said output generating means is latched to a voltage level determined by said first reference voltage after a sequence of activating said first and second control signals, then deactivating said first control signal, thereby generating said latched data output indicative of said voltage difference between said first and second data inputs.

13. The computer system as recited in claim 12, wherein said first switching means of said sense amplifier circuit comprises:

a third transistor having a source connected to said first reference voltage, a drain connected to said drain of said first transistor, and a gate connected to said first control signal, and a fourth transistor having a source connected to said first reference voltage, a drain connected to said drain of said second transistor, and a gate connected to said first control signal.

14. The sense amplifier circuit as recited in claim 12, wherein said second switching means of said sense amplifier circuit comprises a fifth transistor having a source connected to said first reference voltage, a drain connected to said output generating means, and a gate connected to said second control signal.

15. The sense amplifier circuit as recited in claim 12, wherein said output generating means of said sense amplifier circuit comprises:

a first inverter having a data input, a data output, and a reference voltage input connected to said second switching means for receiving said first reference voltage from said second switching means, and a second inverter having a data input, a data output, and a reference voltage input connected to said reference voltage input of said first inverter and said second switching means for receiving said first reference voltage from said second switching means, wherein said output of said second inverter is connected to said source of said second transistor and to said input of said first inverter, and said output of said first inverter is connected to said source of said first transistor and to said input o#said second inverter.

16. The sense amplifier circuit as recited in claim 1, further comprising means for generating said first and second control signals such that said second control signal is activated after said first control signal is activated, and said first control signal is deactivated after said second control signal is activated.

17. The computer system as recited in claim 12, wherein said sense amplifier circuit further includes means for generating said first and second control signals such that said second control signal is activated after said first control signal is activated, and said first control signal is deactivated after said second control signal is activated.

* * * * *

UNITED STATES PATENT AND TRADEMARK OFFICE
CERTIFICATE OF CORRECTION

PATENT NO. : 5,506,524
DATED : April 9, 1996
INVENTOR(S) : Jyhfong Lin

It is certified that error appears in the above-indentified patent and that said Letters Patent is hereby corrected as shown below:

In Column 14, Line 53 in Claim 15 replace:
"said input o#said second inverter."

with
--said input of said second inverter.--

Signed and Sealed this

Twenty-fourth Day of February, 1998

Attest:

BRUCE LEHMAN

*Attesting Officer*     *Commissioner of Patents and Trademarks*